(12) United States Patent
Hirai

(10) Patent No.: US 6,576,352 B2
(45) Date of Patent: Jun. 10, 2003

(54) COLOR-CONVERTING FILM AND LIGHT-EMITTING APPARATUS USING THE SAME

(75) Inventor: Hiroyuki Hirai, Kanagawa-ken (JP)

(73) Assignee: Fuji Photo Film Co., Ltd., Minami-ashigara (JP)

( * ) Notice: Subject to any disclaimer, the term of this patent is extended or adjusted under 35 U.S.C. 154(b) by 0 days.

(21) Appl. No.: 09/820,687

(22) Filed: Mar. 30, 2001

(65) Prior Publication Data

US 2001/0028962 A1 Oct. 11, 2001

(30) Foreign Application Priority Data

Mar. 31, 2000 (JP) ........................................ 2000-097604

(51) Int. Cl.$^7$ ........................ H05B 33/14; C09K 11/06
(52) U.S. Cl. ...................... 428/690; 428/917; 313/112; 313/504; 313/506; 257/98; 359/885
(58) Field of Search .................. 428/690, 917; 313/504, 506, 112; 257/98; 359/885

(56) References Cited

U.S. PATENT DOCUMENTS 6,306,347 B1 * 10/2001 Mason et al. ................. 422/58
6,310,360 B1 * 10/2001 Forrest et al. ................. 257/40
6,403,237 B1 * 6/2002 Noguchi et al. ............. 428/690

FOREIGN PATENT DOCUMENTS

| JP | 3-152897 | 6/1991 |
| JP | 08-286033 | 1/1996 |
| JP | 8-279394 | 10/1996 |
| JP | 9-80434 | 3/1997 |
| JP | 9-092466 | 4/1997 |
| JP | 9-208944 | 8/1997 |

OTHER PUBLICATIONS

Wilde, Ashley P. et al., Journal of Physical Chemistry (1991), 95(2), 629–34.*
Garces, F.O. et al., Inorganic Chemistry (1988), 27(20), 3464–71.*

* cited by examiner

Primary Examiner—Cynthia H. Kelly
Assistant Examiner—Dawn Garrett
(74) Attorney, Agent, or Firm—Burns, Doane, Swecker & Mathis, LLP

(57) ABSTRACT

A color-converting film comprising a light-transmittable substrate and a color-converting layer containing an ortho-metallation complex is excellent in fluorescence conversion efficiency. A light-emitting apparatus comprising the color-converting film and an organic light-emitting device provided on the film can be driven by a low applying voltage.

10 Claims, No Drawings

COLOR-CONVERTING FILM AND LIGHT-EMITTING APPARATUS USING THE SAME

BACKGROUND OF THE INVENTION

The present invention relates to a color-converting film and a light-emitting apparatus using the same.

Self-emission type, high visible, light-emitting apparatuses usable for a lightweight thin display, etc. have been widely studied and developed in recent years. Particularly, attention has been paid to a light-emitting apparatus comprising an organic light-emitting device, which is advantageous in that its emission spectra can be easily controlled and that it can be driven by a low applying voltage.

Known as the multi-color (full-color) light-emitting apparatus using the organic light-emitting device are: (a) apparatuses where three types of light-emitting layers each acting to emit red, green or blue light are disposed on a substrate to form picture elements of the three colors (Japanese Patent Laid-Open Nos. 57-157487, 58-147989, 3-214593, 8-227276, etc.); (b) apparatuses where three types of color filters each acting to separate white light into red, green or blue light are provided on the light output side surface of a white light-emitting device (Japanese Patent Laid-Open Nos. 1-315988, 2-273496, 3-194895, 7-142169, etc.); (c) apparatuses where color-converting films each acting to convert blue light into red or green light are provided on the light output side surface of a blue light-emitting device to obtain three colors (Japanese Patent Laid-Open Nos. 3-152897, 8-279394, 8-286033, 9-80434, 9-92466, 9-208944, etc.); etc. However, the light-emitting apparatuses of above (a) demand complicated processes for disposing the three types of light-emitting layers on the substrate, to be poor in yield and mass-productivity. The light-emitting apparatuses of above (b) exhibit low light-emitting efficiency because most of light emitted therefrom is absorbed by the color filters, thereby requiring high applying voltage. The light-emitting apparatuses of above (c) also require high applying voltage because the conventional color-converting films are not always excellent in fluorescence conversion efficiency.

White light-emitting apparatuses have been conventionally used for illumination light sources, etc. However, such the conventional white light-emitting apparatuses that are described in publications recited as references for the apparatuses of (b) need a plurality of light-emitting materials, whereby color balance of light emission thereof is often changed over time.

OBJECT AND SUMMARY OF THE INVENTION

An object of the present invention is to provide a color-converting film excellent in fluorescence conversion efficiency, and a light-emitting apparatus comprising the color-converting film, which can be driven by a low applying voltage with high stability and can be easily produced with high yield.

As a result of intense research in view of the above object, the inventor has found that a color-converting film using an ortho-metallation complex is excellent in the fluorescence conversion efficiency, and that a light-emitting apparatus comprising the color-converting film and an organic light-emitting device can be driven by low applying voltage. The present invention has been accomplished by the findings.

Thus, a color-converting film of the present invention comprises a light-transmittable substrate and a color-converting layer containing an ortho-metallation complex disposed thereon.

The color-converting layer preferably contains a dye and/or a pigment, the dye being preferably selected from the group consisting of stilbene compounds, coumalin compounds, cyanine compounds, pyridine compounds, xanthine compounds, naphthalic imide compounds and oxazine compounds. The dye-content is preferably 0.1 to 20 weight % in the color-converting layer.

The ortho-metallation complex is preferably an iridium complex, a palladium complex or a platinum complex, particularly preferably an iridium complex. The ortho-metallation complex preferably includes at least one ligand selected from the group consisting of 2-phenyl pyridine derivatives, 7,8-benzoquinoline derivatives, 2-(2-thienyl) pyridine derivatives, 2-(1-naphthyl)pyridine derivatives and 2-phenylquinoline derivatives. The content of the ortho-metallation complex is preferably 0.1 to 99 weight % in the color-converting layer.

The color-converting film of the present invention preferably comprises a light-shielding layer. The light-shielding layer is preferably disposed on the upper surface or the lower surface of the light-transmittable substrate.

A light-emitting apparatus of the present invention comprises the above color-converting film, and an organic light-emitting device having a transparent electrode, an organic light-emitting layer and a counter electrode provided on the color-converting film. The light-emitting apparatus of the present invention is usable as a multi-color light-emitting apparatus or a white light-emitting apparatus.

DETAILED DESCRIPTION OF THE PREFERRED EMBODIMENTS

[1] Color-Converting Film

A color-converting film of the present invention comprises a light-transmittable substrate and a color-converting layer disposed thereon, and preferably further comprises a light-shielding layer. Components for the color-converting film will be described in detail below.

(A) Light-Transmittable Substrate

The light-transmittable substrate used in the present invention preferably has a visible light transmittance of 50% or more. The light-transmittable substrate may be made of a glass, quartz, a printing medium, polyethylene terephthalate, polybutylene terephthalate, polyethylene naphthalate, polystyrene, polycarbonate, polyethersulfone, polyarylate, allyldiglycol carbonate, polycyclolefin, etc. When the light-transmittable substrate is made of a plastic, on at least one surface of the light-transmittable substrate is preferably disposed a moisture permeation-inhibiting layer and/or a gas barrier layer. Such layers are preferably made of an inorganic compound such as silicon nitride, silicon oxide and non-alkali glass. The moisture permeation-inhibiting layer and the gas barrier layer may be provided by a radio frequency sputtering method, etc. A hard coat layer and an under coat layer may be also disposed on the light-transmittable substrate, if necessary.

(B) Color-Converting Layer

The color-converting layer used in the present invention contains an ortho-metallation complex, and preferably contains a dye (dyestuff) and/or a pigment, which absorb the short wavelength lights such as a blue light and emit the long wavelength lights such as a red light and a green light. The ortho-metallation complex, the dye and the pigment may be dispersed in the light-transmittable substrate mentioned above.

Preferable examples of the dye include: stilbene compounds (1,4-bis(2-methylstyryl)benzene, trans-4,4'- diphenylstilbene, etc.); coumalin compounds (coumalin -4, coumalin-153, coumalin-6, coumalin-7, etc.); cyanine compounds (4-dicyanomethylene-2-methyl-6-(p-dimethylaminostilbene)-4H-pyrane, etc.); pyridine compounds (1-ethyl-2-(4-(p-dimethylaminophenyl)-1,3-butadienyl)pyridium perchlorate, etc.); xanthine compounds (Rhodamine B, Rhodamine 6G, Rhodamine 3B, Rhodamine 101, Rhodamine 110, Basic Violet 11, Sulfo Rhodamine 101, etc.); naphthalic imide compounds (Solvent Yellow 44, Solvent Yellow 116, etc.); and oxazine compounds. Further, various kinds of dyes or dyestuffs such as direct dyes, acidic dyes, basic dyes, dispersion dyes, etc. also may be used. The dye may be added to a layer other than the color-converting layer. Examples of the pigment include polymethacrylates, polyvinylchloride, vinylchloride-vinylacetate copolymers, alkyd resins, aromatic sulfonamide resins, urea resins, melamine resins, benzoguanamine resins, etc. The weight ratio of the dye to the pigment is preferably 0.1 to 10 weight %, more preferably 1 to 7 weight %. Further, the dye-content in the color-converting layer is preferably 0.1 to 20 weight %, more preferably 1 to 10 weight %. The dyes and pigments may be used singly or as a mixture of a plurality of kinds thereof. From the viewpoint of increasing energy-transporting efficiency, it is preferred that a plurality of the dyes or pigments are mixed to use.

The ortho-metallation complex used in the present invention may be such a compound that is described in: Akio Yamamoto, "Yukikinzoku-Kagaku, Kiso to Oyo (Metalorganic chemistry, Foundation and Application)", Page 150 to 232, Shokabo Publishing Co., Ltd., (1982); H. Yersin, "Photochemistry and Photophysics of Coordination Compounds", Page 71 to 77 and 135 to 146, Springer-Verlag, Inc. (1987), etc. The ortho-metallation complex includes a particular ligand, which is preferably a 2-phenyl pyridine derivative, a 7,8-benzoquinoline derivative, a 2-(2-thienyl)pyridine derivative, a 2-(1-naphthyl)pyridine derivative or a 2-phenylquinoline derivative. The ortho-metallation complex may include a ligand other than the particular ligand. A metal atom included in the ortho-metallation complex is preferably Ir, Pd or Pt, particularly preferably Ir. The ortho-metallation complex used in the present invention preferably emits light by triplet exciton from the viewpoint of improving the light-emitting efficiency of the light-emitting apparatus. The ortho-metallation complex-content in the color-converting layer may be selected from large range, and it is, for example, preferably 0.1 to 99 weight %, more preferably 1 to 20 weight %.

The color-converting layer may be provided in the manner comprising the steps of: dissolving or dispersing the ortho-metallation complex and the dye, the pigment, etc. in a solvent with a binder to prepare a solution or a dispersion; and disposing the solution or the dispersion on the substrate by a known method such as a casting method, a spin-coating method, a printing method, a bar-coating method, a roll-coating method, a spraying method, etc.

Used as the binder may be a transparent high molecular compounds such as polymethylmethacrylate, polyacrylate, polycarbonate, polyvinyl alcohol, polyvinylalcohol, polyvinylpyrrolidone, hydroxyethylcellulose, carboxymethylcellulose, poly(2-vinylpyridine), poly(4-vinylpyridine), poly(p-N,N-dimethylaminomethylstyrene), 4-vinylpyridine-butyl methacrylate copolymer (mole ratio= 1/1), 2-vinylpyridine-styrene copolymer (mole ratio=7/3), etc. Particularly, in the case where the color-converting layer is patterned, a basic high molecular compound such as polyvinylpyridine is preferably used as the binder because the color-converting layer using such a compound can be subjected to an etching treatment using an acidic solution. Further, a photo-setting resist such as an acrylic resin also may be used as the binder.

(C) Light-Shielding Layer

The light-shielding layer acts not only to prevent emission light from straying between the picture elements, but also to photo-mask the color-converting layer when it is patterned. The light-shielding layer is preferably disposed on the upper surface, which means the color-converting layer side surface, of the light-transmittable substrate. Also, the light-shielding layer is preferably disposed on the lower surface, which means the opposite side surface of the upper surface, of the light-transmittable substrate. The light-shielding layer is preferably made of a substantially black material having a density (absorbance) of 0.5 or more in the wavelength region of 300 to 900 nm. The substantially black material may be an inorganic compound such as chromium and chromium oxide, carbon, etc. The light-shielding layer may be provided by spattering or vapor-depositing. Also, the light-shielding layer may be provided by a coating method comprising the steps of dispersing the substantially black material in a high molecular compound solution, and coating the resultant dispersion on the color-converting layer. In the coating method, the dispersion preferably contains the substantially black material of 0.1 to 50 weight %. The high molecular compound used for the dispersion may be the same compound as the binder mentioned above.

[2] Light-Emitting Apparatus

A light-emitting apparatus of the present invention comprises the above color-converting film and an organic light-emitting device provided on the color-converting film. The organic light-emitting device has a transparent electrode, an organic light-emitting layer and a counter electrode, and the transparent electrode acts as a positive electrode and the counter electrode acts as a negative electrode in general. The transparent electrode may be a negative electrode, and in this case, the counter electrode is a positive electrode. The light-emitting apparatus is usable as a multi-color light-emitting apparatus or a white light-emitting apparatus.

The light-emitting apparatus of the present invention may have such a structure as: (i) a structure where the light-transmittable substrate of the color-converting film is adhered to a substrate of the organic light-emitting device through the color-converting layer; (ii) a structure described in Japanese Patent laid-Open No. 8-279394, where the transparent electrode is directly disposed on the color-converting film through a transparent adhesion layer, a protective layer, etc., and thereon is further disposed the organic light-emitting layer and the counter electrode. In the constitution of (i), the substrate of the organic light-emitting device may be made of a material the same as that for the light-transmittable substrate of the color-converting film. In the constitution of (ii), examples of the materials for the transparent adhesion layer and the protective layer include polymethylmethacrylate, polyacrylate, polycarbonate, polyester, polyvinylalcohol, polyvinylpyrrolidone, hydroxyethyl cellulose, carboxymethyl cellulose, polyamide, silicone resins, epoxy resins, and various kinds of light-sensitive resins such as photo-setting type resins, etc. A transparent insulating inorganic oxide layer made of silicon oxide, silicon nitride, titanium oxide, etc. may be disposed between the transparent adhesion layer or the protective layer and the transparent electrode.

The organic light-emitting device used in the present invention may have an organic compound layer other than the organic light-emitting layer, for example, an electron-transporting layer, a hole-transporting layer, an electron-injecting layer, a hole-injecting layer, etc. The organic light-emitting device may comprise a plurality of the hole-transporting layers, the organic light-emitting layers, the electron-transporting layers, etc. Further, an electrically conductive polymer layer may be disposed on the organic light-emitting layer side surface of the transparent electrode, and a block layer is preferably disposed on the counter electrode side surface of the organic light-emitting layer to prevent holes from penetrating into the counter electrode.

The organic light-emitting device used in the present invention may have a micro-optical resonator structure (microcavity structure). The micro-optical resonator type organic light-emitting device is constituted of, for example, a multi-layered film mirror, a transparent electrode (a positive electrode), at least one organic compound layer including a organic light-emitting layer, and a counter electrode (a negative electrode) disposed in this order on a transparent substrate. Therein, the micro-optical resonator is formed between the multi-layered film mirror and the counter electrode serving as a metal mirror. In general, the multi-layered film mirror is obtained by laminating two types of layers made of a dielectric or a semiconductor alternately, each of the layers exhibiting a different refractive index, and having an optical length designed to be ¼ of the emission wavelength of the organic light-emitting device. For example, the multi-layered film mirror may be composed of $TiO_2$ layers and $SiO_2$ layers, $SiN_x$ layers and $SiO_2$ layers, $Ta_2O_5$ layers and $SiO_2$ layers, GaAs layers and GaInAs layers, etc. An $SiO_2$ spacer may be interposed between the multi-layered film mirror and the transparent electrode to control the entire thickness of the micro-optical resonator. Further, it is preferable that the uppermost layer of the multi-layered film mirror is a transparent electrically conductive layer, which also acts as the transparent electrode. In this case, the transparent electrode can be relatively thickened to reduce the surface resistance of the transparent electrode, thereby preventing the organic light-emitting device from heat-evolving. The micro-optical resonator type organic light-emitting device is described in "Organic EL Display", Page 105 (Technotimes Co., a separate volume of "Monthly Display", the October issue of 1998), Japanese Patent Laid-Open No. 9-180883, etc.

The organic compound layer in the organic light-emitting device used in the present invention may be formed by a known method such as a vacuum vapor deposition method, a sputtering method, a dipping method, a spin-coating method, a casting method, a bar-coating method, a roll-coating method, etc. A plurality of the organic compound layers may be multi layer-coated while appropriately selecting a solvent for each layer.

The inorganic layer such as the electrodes may be formed by a known method such as a vacuum vapor deposition method, a sputtering method, an ion-plating method, etc. The electrodes may be patterned by a chemical etching method such as a photolithography, a physical etching method using laser, etc. Also, the patterned electrode may be obtained by vacuum vapor deposition, sputtering, etc. while masking.

The organic light-emitting device used in the present invention may be such that emits light when direct current voltage or pulse current is applied between the positive electrode and the negative electrode. The direct current voltage is generally a pulse voltage of 2 to 30 volts, which may contain alternating voltage if necessary. Further, the organic light-emitting device may be driven by a method described in Japanese Patent Laid-Open Nos. 2-148687, 5-29080, 5-107561, 6-301355, 7-134558, 8-234685, 8-241047, etc.

The components of the organic light-emitting device used in the present invention will be described in detail below.

(A) Electrode

The positive electrode may be made of a known material such as tin oxide, fluorine-doped tin oxide, ITO (Indium Tin Oxide), IZO (Indium Zinc Oxide), etc. A metal thin film of gold, platinum, etc. may be also used as the positive electrode. Further, an organic material such as polyaniline, polythiophene, polypyrrole and derivatives thereof may be used for the positive electrode. Furthermore, a transparent electrically conductive film described in "Tomei-dodenmaku no Shintenkai (Development of the Transparent Electrically Conductive Film)" (supervised by Yutaka Sawada, CMC, Ink., 1999), etc. may be used as the positive electrode. The positive electrode is preferably a transparent electrode of ITO or IZO formed at such a low temperature as 150° C. or less. The method for forming the positive electrode at a low temperature is particularly suitable for the case of using a plastic substrate having a low thermal resistance.

The negative electrode is preferably made of a material having a small work function, for example, an alkaline metal such as Li, K and Cs, an alkaline earth metal such as Mg and Ca, etc. from the viewpoint of electron-injecting properties. Stable materials having high oxidation resistance such as Al are also preferably used for the negative electrode. The negative electrode may be made of two or more materials to obtain both the excellent electron-injecting properties and high stability (see, Japanese Patent Laid-Open Nos. 2-15595, 5-121172, etc.). In the organic light-emitting device used in the present invention, the negative electrode is particularly preferably made of a material mainly composed of aluminum from the viewpoint of the stability during storage. Incidentally, the term "material mainly composed of aluminum" as used herein means aluminum, or an alloy or a mixture composed of 0.01 to 10 weight % of an alkaline metal or an alkaline earth metal and the balance being substantially aluminum.

(B) Hole-transporting Layer

Examples of the hole-transporting material for the hole-transporting layer include poly-N-vinylcarbazole derivatives, polyphenylenevinylene derivatives, polyphenylene, polythiophene, polymethylphenylsilane, polyaniline, triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, carbazole derivatives, styrylanthracene derivatives, fluorenone derivatives, hydrazone derivatives, stilbene derivatives, porphyrin derivatives such as phthalocyanine compounds, aromatic tertiary amine compounds, styrylamine compounds, butadiene compounds, benzidine derivatives, polystyrene derivatives, triphenylmethane derivatives, tetraphenylbenzene derivatives, starburst polyamine derivatives etc.

(C) Organic Light-Emitting Layer

The light-emitting material for the organic light-emitting layer is not particularly limited, and any materials that can be excited to emit light may be used in the present invention. Examples of the light-emitting material include oxinoid compounds, perylene compounds, coumalin compounds, azacoumalin compounds, oxazole compounds, oxadiazole compounds, perinone compounds, pyrrolopyrrole compounds, biphenyl compounds, naphthalene compounds, anthracene compounds, fluorene compounds, fluoranthene compounds, tetracene compounds, pyrene compounds, coronene compounds, quinolone compounds, azaquinolone compounds, pyrazoline compounds, pyrazolone compounds, rhodamine compounds, chrysene compounds, phenanthrene compounds, cyclopentadiene compounds, stilbene compounds, diphenylquinone compounds, styryl compounds, distyrylbenzene compounds, butadiene compounds, dicyanomethylenepyran compounds, dicyanomethylenethiopyran compounds, fluorescein compounds, pyrylium compounds, thiapyrylium compounds, selenapyrylium compounds, telluropyrylium compounds, aromatic aldadiene compounds, oligophenylene compounds, xanthene compounds, thioxanthene compounds, cyanine compounds, acridine compounds, acridone compounds, quinoline compounds, metal complexes containing 8-hydroxyquinoline derivatives, beryllium complexes containing benzoquinolinol derivatives, metal complexes containing 2,2'-bipyridine derivatives, group III metal complexes containing a Schiff base, metal complexes containing oxadiazole derivatives, rare earth metal complexes, etc. These light-emitting materials may be used singly or together with each other.

Light-emitting polymers are also preferably used as the light-emitting material. Examples of the light-emitting polymer include: π-conjugated polymers such as poly-p-phenylenevinylene, polyfluorene, polythiophene and derivatives thereof; polymers comprising a low molecular weight dye, and tetraphenyldiamine or triphenylamine in main- or side-chain thereof; etc. The light-emitting polymer may be mixed with the low molecular weight light-emitting material mentioned above to be used for the organic light-emitting layer.

With the above-mentioned light-emitting materials may be doped the electron-transporting layer or the hole-transporting layer, to make this layer also act as the organic light-emitting layer. Further, an ortho-metallation complex is preferably added to the organic light-emitting layer as a dopant.

In this invention, it is particularly preferable that the organic light-emitting layer is made of the material emitting light in a wavelength region from the near ultraviolet region to the green visible region. Examples of such a light-emitting material include p-polyphenylene compounds, benzothiazole compounds, benzoimidazole compounds, benzoxazole compounds, oxinoid compounds chelating with metal, styrylbenzene compounds, aromatic dimethylidene compounds, etc.

(D) Electron-transporting Layer

Examples of the electron-transporting material for the electron-transporting layer include oxadiazole derivatives, triazole derivatives, triazine derivatives, nitro-substituted fluorenone derivatives, thiopyran dioxide derivatives, diphenylquinone derivatives, tetracarboxylperylene derivatives, anthraquinodimethane derivatives, fluorenylidenemethane derivatives, anthrone derivatives, perynone derivatives, oxine derivatives, derivatives of quinoline complexes, etc.

(E) Electron-Injecting Layer

It is preferable that an insulation thin film is disposed as the electron-injecting layer between the negative electrode and the organic light-emitting layer or the electron-transporting layer. The insulation thin film is preferably such that has a thickness of 0.01 to 10 nm and is made of aluminum oxide, lithium fluoride, cesium fluoride, etc.

(F) Sealing Layer

A sealing layer is preferably formed on the organic light-emitting device, to prevent permeation of moisture or oxygen into the device. Examples of a material for the sealing layer include: glasses, copolymers of tetrafluoroethylene and at least one comonomer; fluorine-containing copolymers having a cyclic structure in the main chain; polyethylene; polypropylene; poly(methyl methacrylate); polyimides; polyureas; polytetrafluoroethylene; polychlorotrifluoroethylene; polydichlorodifluoroethylene; copolymers of chlorotrifluoroethylene and dichlorodifluoroethylene; a moisture-absorbing substance having a water absorption of 1% or more; a moisture-resistant substance having a water absorption of 0.1% or less; metals such as In, Sn, Pb, Au, Cu, Ag, Al, Ti and Ni; metal oxides such as MgO, SiO, $SiO_2$, $Al_2O_3$, GeO, NiO, CaO, BaO, $Fe_2O_3$, $Y_2O_3$ and $TiO_2$; metal fluorides such as $MgF_2$, LiF, $AlF_3$ and $CaF_2$; liquid fluorinated carbons such as perfluoroalkanes, perfluoroamines and perfluoroethers; dispersions prepared by adding an adsorbent for adsorbing moisture or oxygen to the liquid fluorinated carbon; etc.

(G) Others

In the organic light-emitting device used in the present invention, a p-type inorganic semiconductor layer or an electrically conductive polymer layer may be disposed on the hole-transporting layer side surface of the positive electrode. When each of these layers is provided in the organic light-emitting device, the organic compound layer can be thickened with little increase of the driving voltage, thereby preventing light-emitting irregularity and short circuit.

Prefferred examples of the p-type inorganic semiconductor include $Si_{1-x}C_x$ ($0 \leq x \leq 1$), CuI, $Cu_2S$, CuSCN, etc. These p-type inorganic semiconductors may be used singly or as a mixture of a plurality thereof. Preferable as the electrically conductive polymer for use in the electrically conductive polymer layer are polyaniline derivatives, polythiophene derivatives and polypyrrole derivatives described in WO 98/05187, etc. These electrically conductive polymers may be mixed to use with a protonic acid such as camphorsulfonic acid, p-toluenesulfonic acid, styrenesulfonic acid and polystyrenesulfonic acid, and/or the other polymer such as poly(methyl methacrylate) (PMMA), poly(N-vinylcarbazole) (PVCz), etc. The electrically conductive polymer layer preferably has a surface resistance of 10000 Ω/square or less. The thickness of the electrically conductive polymer layer is preferably 10 to 1000 nm, more preferably 50 to 500 nm.

EXAMPLES

The present invention will be explained in further detail by the following examples without intention of restricting the scope of the present invention defined by the claims attached hereto.

Example 1

Production of Blue Light-Emitting Device

On a glass substrate of 2.5 cm×2.5 cm in size and 0.4 mm in thickness was sputtered ITO to a thickness of 250 nm by DC magnetron sputtering method, and the sputtered ITO was then patterned to obtain a transparent electrode having surface resistance of 6 Ω/square. The transparent electrode was washed with isopropyl alcohol (IPA) and subjected to an oxygen plasma treatment. Then, on the transparent electrode was disposed: a hole-injecting layer of copper phthalocyanine having a thickness of 10 nm; a hole-transporting layer of 4,4'-bis[N-(1-naphthyl)-N-phenylamino]biphenyl (NPD) having a thickness of 40 nm; a light-emitting layer of 2-{4-(9-9H-tribenzo[b,d,f]azepinyl)phenyl}-1-(biphenyl-2-yl)imidazo[4,5-b]pyridine having a thickness of 20 nm; an electron-transporting layer of 2,2',2"-(1,3,5-benzentriyl)tris (3-phenyl-3H-imidazo[4,5-b]pyridine) having a thickness of 40 nm; and an electron-injecting layer of LiF having a thickness of 1 nm in this order by vacuum vapor deposition. Further, a negative electrode of Al having a thickness of 150 nm was disposed on the electron-injecting layer by vacuum vapor deposition using a mask, to obtain the blue light-emitting device exhibiting an emission peak wavelength of 415 nm.

Example 2

Preparation of Color-Converting Film G1 and Production of Green Light-Emitting Apparatus Poly(N-vinylcarbazole) and bis(2-phenylpyridine)-acetylacetone-iridium complex of 2 weight % based on poly(N-vinylcarbazole) were dissolved in dichloroethane, and the resultant solution was bar-coated on a glass of 0.4 mm thickness and dried to prepare the color-converting film G1 having a thickness of 18 μm for converting blue light into green light. The color-converting film G1 was then placed in a glove box, and the glass surface thereof was made to adhere to the glass surface of the blue light-emitting device obtained in Example 1 through a UV-setting adhesive followed by sealing under nitrogen, to obtain a green light-emitting apparatus of the present invention.

To the blue light-emitting device of the green light-emitting apparatus was applied direct current voltage to provide blue light of 100 cd/m$^2$, and the output light from the color-converting film G1 was evaluated. As a result, the output light was green light of 120 cd/m$^2$ exhibiting an emission peak wavelength of 522 nm, thus, it was found that the blue light was efficiently converted to the green light by the color-converting film G1.

Example 3

Preparation of Color-Converting Film G2, G3 and G4 and Production of Green Light-Emitting Apparatuses The color-converting film G2, G3 and G4 were prepared in the same manner as the preparation of the color-converting film G1 except that tris(2-phenyl-3-methylpyridine)iridium complex, bis[2-(2-thienyl)pyridine]-acetylacetone-iridium complex, or bis(2-phenylbenzothiazole)-acetylacetone-iridium complex was used instead of bis(2-phenylpyridine)-acetylacetone-iridium complex, respectively. Further, each green light-emitting apparatus of the present invention using the color-converting film G2, G3 or G4 was obtained in the same manner as Example 2.

The output light from each of the green light-emitting apparatuses was evaluated in the same manner as Example 2. As a result, the apparatus using the film G2 provided green or yellowish green light of 125 cd/m$^2$ exhibiting an emission peak wavelength of 521 nm, the apparatus using the film G3 provided green or yellowish green light of 118 cd/m$^2$ exhibiting an emission peak wavelength of 568 nm, and the apparatus using the film G4 provided green or yellowish green light of 131 cd/m$^2$ exhibiting an emission peak wavelength of 560 nm.

Example 4

Preparation of Color-Converting Film R1 and Production of Red Light-Emitting Apparatus The color-converting film R1 was prepared in the same manner as the preparation of the color-converting film G1 except that bis(2-phenylquinoline)acetylacetone-iridium complex was used instead of bis(2-phenylpyridine)acetylacetone-iridium complex and that film thickness was 40 μm. Further, a red light-emitting apparatus of the present invention using the color-converting film R1 was obtained in the same manner as Example 2.

The output light from the red light-emitting apparatus was evaluated in the same manner as Example 2. As a result, the output light was red light of 20 cd/m$^2$ exhibiting an emission peak wavelength of 603 nm, thus, it was found that the blue light was efficiently converted to the red light by the color-converting film R1.

Comparative Example 1

Preparation of Color-Converting Film R2 and Production of Red Light-Emitting Apparatus The comparative color-converting film R2 was prepared in the same manner as the preparation of the color-converting film R1 except that Rhodamine 6G was used instead of bis(2-phenylquinoline)-acetylacetone-iridium complex. Further, a comparative red light-emitting apparatus using the color-converting film R2 was obtained in the same manner as Example 2.

The output light from the comparative red light-emitting apparatus was evaluated in the same manner as Example 2. As a result, the output light was pale red light of 4 cd/m$^2$ exhibiting an emission peak wavelength of 605 nm, thus, it was found that the comparative color-converting film R2 was remarkably inferior to the color-converting film R1 of the present invention in fluorescence conversion efficiency.

Example 5

Preparation of Color-Converting Film W1 and Production of White Light-Emitting Apparatus Poly(N-vinylcarbazole), bis(2-phenylpyridine)-acetylacetone-iridium complex of 0.5 weight % based on poly(N-vinylcarbazole), and bis(2-phenylquinoline)-acetylacetone-iridium complex of 1 weight % based on poly(N-vinylcarbazole) were dissolved in dichloroethane, and the resultant solution was bar-coated on a glass of 0.4 mm thickness and dried to prepare the color-converting film W1 having a thickness of 18 μm for converting blue light into white light. Further, a white light-emitting apparatus of the present invention using the color-converting film W1 was obtained in the same manner as Example 2.

The output light from the white light-emitting apparatus was evaluated in the same manner as Example 2. As a result, the output light was white light of 85 cd/m$^2$.

Example 6

Production of Dot Array Light-Emitting Apparatus

On the glass substrate of 5.0 cm×5.0 cm in size and 0.7 mm in thickness were disposed chrome lines each having a width of 50 μm as a light-shielding layer having a density of 3 at a regular interval of 200 μm by sputtering. On the obtained glass substrate having the chrome lines was bar-coated a dichloroethane solution including poly(N-vinylcarbazole) and bis(2-phenylbenzothiazole)-acetylacetone-iridium complex of 2 weight % based on poly(N-vinylcarbazole), and the resultant was dried to prepare the color-converting film having a thickness of 18 μm for converting blue light into yellowish green light.

SiO$_2$ protective layer of 200 nm thickness was disposed on thus-obtained color-converting film by sputtering. Then, ITO was sputtered on the SiO$_2$ protective layer to a thickness of 200 nm by DC magnetron sputtering method, and patterned correspondingly to the light-shielding layer pattern while using positive resist, to obtain the positive electrode having a surface resistance of 30 Ω/square. Thus, ITO positive electrode lines each having a width of 200 μm were formed at a regular interval of 50 μm in this process.

After the positive electrode was washed with IPA and subjected to an oxygen plasma treatment, poly(3,4-ethylenedioxythiophene)-polystyrene sulfonic acid aqueous dispersion ("Baytron P" manufactured by BAYER AG., solid contents: 1.3%) was spin-coated on the positive electrode and vacuum-dried at 150° C. for 1 hour, to form electrically conductive polymer layer having a thickness of 150 nm. Further, a toluene solution including 1 weight % of poly(9,9-dioctylfluorene) and 1 weight % of poly[9,9-dioctylfluorene-co-(bis-N,N'-phenyl-bis-N,N'-phenylbenzidine)] was spin-coated on the electrically conductive polymer layer under nitrogen, and dried to form a light-emitting layer having a thickness of 70 nm.

Then, Ca lines, which are perpendicular to the ITO positive electrode lines, were vapor-deposited to 80 nm thickness at a regular interval of 200 μm on the light-emitting layer while masking, and further thereon was vapor-deposited Al to 70 nm thickness, to provide a negative electrode. Finally, the resultant laminate was sealed by a UV-setting adhesive under nitrogen in a glove box, to obtain a dot array light-emitting apparatus of the present invention.

When to the ITO positive electrode and the negative electrode of thus-obtained dot array light-emitting apparatus was applied 6 V of direct current voltage, the dot array light-emitting apparatus emitted green light of 2000 cd/m$^2$, which was converted from blue light provided by the light-emitting device of the apparatus.

As described in detail above, a color-converting film of the present invention is excellent in fluorescence conversion efficiency, and a light-emitting apparatus of the present invention comprising the color-converting film can be driven by a low applying voltage. Further, a multi-color light-emitting apparatus of the present invention can be easily produced without complicated processes for disposing a plurality of light-emitting layers on a substrate, thereby being excellent in production yield. Furthermore, a white light-emitting apparatus of the present invention does not need a plurality of light-emitting materials, to exhibit high stability over time.

What is claimed is:

1. A light-emitting apparatus comprising: a color-converting film comprising a light-transmittable substrate and a color-converting layer containing an ortho-metallation complex that is disposed on said light-transmittable substrate; and an organic light-emitting device having a transparent electrode, an organic light-emitting layer and a counter electrode; and said organic light-emitting device is provided on said color-converting film.

2. The light-emitting apparatus according to claim 1, wherein said color-converting layer contains a dye or a pigment or mixtures thereof.

3. The light-emitting apparatus according to claim 2, wherein said color-converting layer contains at least one dye selected from the group consisting of stilbene compounds, coumalin compounds, cyanine compounds, pyridine compounds, xanthine compounds, naphthalic imide compounds, and oxazine compounds.

4. The light-emitting apparatus according to claim 2, wherein the content of said dye is 0.1 to 20 weight % in said color-converting layer.

5. The light-emitting apparatus according to claim 1, wherein said ortho-metallation complex is an iridium complex, a palladium complex, or a platinum complex.

6. The light-emitting apparatus according to claim 5, wherein said ortho-metallation complex is an iridium complex.

7. The light-emitting apparatus according to claim 1, wherein said ortho-metallation complex includes at least one ligand selected from the group consisting of 2-phenyl pyridine derivatives, 7,8-benzoquinoline derivatives, 2-(2-thienyl)pyridine derivatives, 2-(1-naphthyl)pyridine derivatives, and 2-phenylquinoline derivatives.

8. The light-emitting apparatus according to claim 1, wherein the content of said ortho-metallation complex is 0.1 to 99 weight % in said color-converting layer.

9. The light-emitting apparatus claim 1, comprising a light-shielding layer.

10. The light-emitting apparatus according to claim 9, wherein said light-shielding layer is disposed on the upper surface or the lower surface of said light-transmittable substrate.

* * * * *